United States Patent [19]
Kim et al.

[11] Patent Number: 6,095,405
[45] Date of Patent: Aug. 1, 2000

[54] METHOD FOR SOLDERING INTEGRATED CIRCUITS

[75] Inventors: Choul-su Kim; Woo-sik Kim; Byung-woo Woo; Masaharu Tsukue, all of Kyonggi-do, Rep. of Korea

[73] Assignee: SamSung Electronics Co., Ltd., Kyungki-do, Rep. of Korea

[21] Appl. No.: 09/127,630

[22] Filed: Aug. 3, 1998

[30] Foreign Application Priority Data

Aug. 1, 1997 [KR] Rep. of Korea ............... 97-36818

[51] Int. Cl.[7] ............... B23K 31/02; B23K 35/00
[52] U.S. Cl. ............... 228/180.21; 228/213; 228/222; 228/234.1
[58] Field of Search ............... 228/180.21, 214, 228/222, 46, 6.2, 212, 213, 234.1

[56] References Cited

U.S. PATENT DOCUMENTS

| | | |
|---|---|---|
| 4,346,514 | 8/1982 | Makizawa et al. . |
| 4,415,116 | 11/1983 | Norton ............... 228/180 |
| 4,696,104 | 9/1987 | Vanzetti . |
| 4,829,665 | 5/1989 | Kabeshita et al. . |
| 4,944,444 | 7/1990 | Renner ............... 228/214 |
| 4,979,290 | 12/1990 | Chiba ............... 228/180.2 |
| 5,180,096 | 1/1993 | Kondo ............... 228/180.1 |
| 5,240,170 | 8/1993 | Nishida et al. . |
| 5,501,005 | 3/1996 | Onitsuka . |
| 5,524,812 | 6/1996 | Taniguchi et al. ............... 228/180.1 |
| 5,579,987 | 12/1996 | Lee et al. . |
| 5,582,753 | 12/1996 | Vos ............... 228/8 |
| 5,682,675 | 11/1997 | Hirota . |
| 5,692,669 | 12/1997 | Sakemi et al. . |
| 5,765,277 | 6/1998 | Jin et al. ............... 228/6.2 |
| 5,871,592 | 2/1999 | Asagi et al. ............... 228/180.1 |
| 5,908,282 | 6/1999 | Onodera ............... 414/783 |
| 5,925,210 | 7/1999 | Wagenbrenner et al. ............... 156/306.9 |
| 5,946,597 | 8/1999 | Miura et al. ............... 228/180.22 |

*Primary Examiner*—Gregory Mills
*Assistant Examiner*—Jonathan Johnson
*Attorney, Agent, or Firm*—Robert E. Bushnell, Esq.

[57] ABSTRACT

Any one of at least two holding blocks loaded in a holding block storing portion is picked up and moved to cover an IC on a PCB of a PCB array. A light beam is applied to the whole surface of the PCB. The holding block is moved from the PCB to the holding block storing portion and cooled. It is then determined whether any other PCB to be soldered exists in the PCB array. If it is determined that any other PCB to be soldered exists in the PCB array, another holding block is picked up from the holding block storing portion and moved to cover an IC on the PCB of the PCB array. The above steps are repeated until all the PCBs of the PCB array to be soldered are completely soldered. If it is determined that any other PCB to be soldered does not exist in the PCB array, the PCB array is transferred to a subsequent process.

14 Claims, 6 Drawing Sheets

EARLIER ART

EARLIER ART

EARLIER ART

EARLIER ART

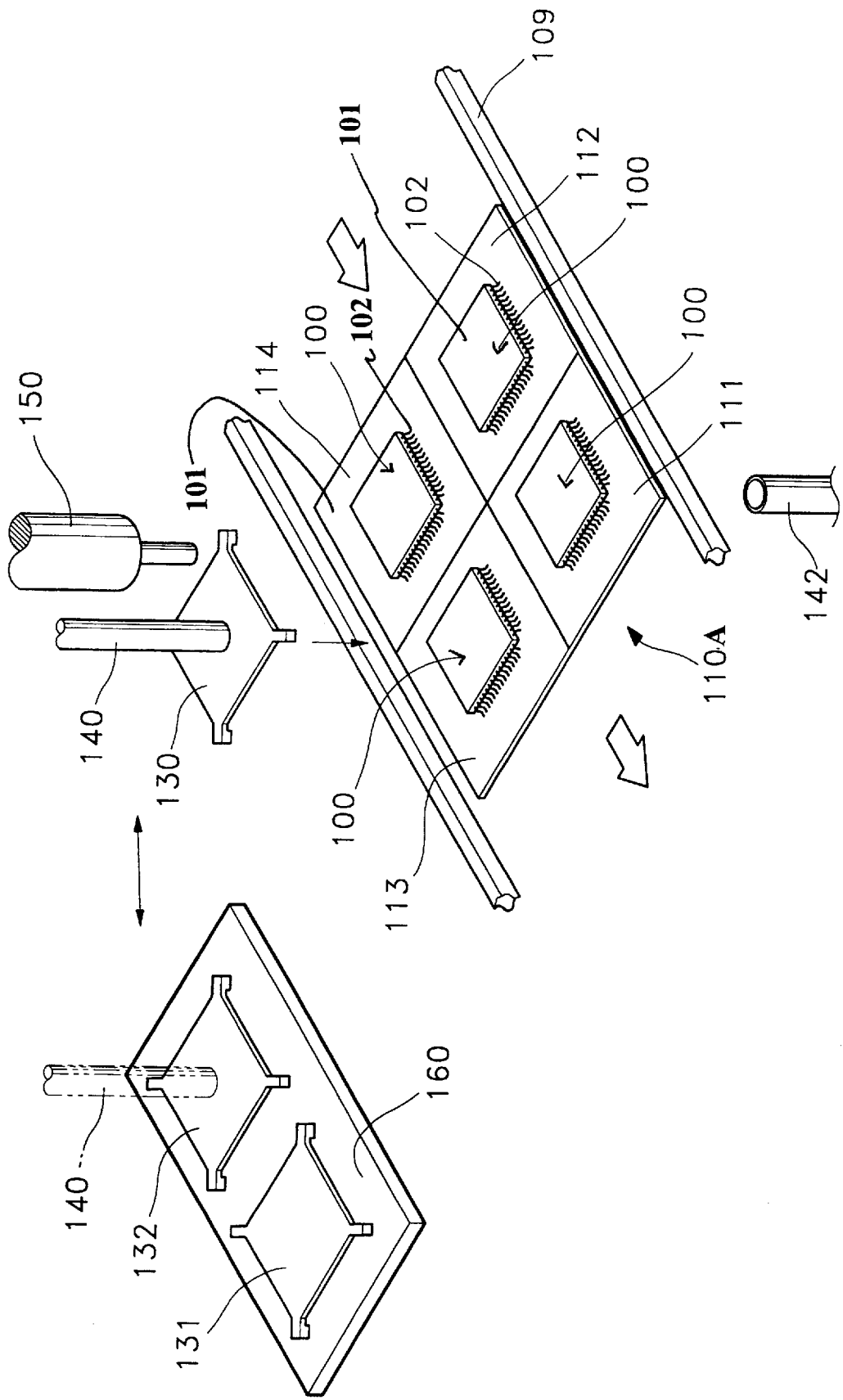

METHOD FOR SOLDERING INTEGRATED CIRCUITS

CLAIM OF PRIORITY

This application makes reference to, incorporates the same herein, and claims all benefits accruing under 35 U.S.C. §119 from an application for METHOD AND APPARATUS FOR SOLDERING INTEGRATED CIRCUITS earlier flied in the Korean Industrial Property Office on Aug. 1, 1997 and there duly assigned Serial No. 36818/1997.

BACKGROUND OF THE INVENTION

1. Field of the Invention

The present invention relates to apparatus for soldering integrated circuits(ICs) and, more particularly, to apparatus for soldering ICs including a plurality of leads using two holding blocks by turns, and thereby reducing soldering time.

2. Description of the Related Art

The present invention will be more thoroughly understood by reference to a tape carrier package (TCP) type pentium processor® as an example of an IC.

The TCP type pentium processor® is an extremely minute component including 320 leads is as input and output terminals. An interval between the leads is 0.25 mm. In addition, such a TCP type IC is relatively small because it does not include any wire-bonded portion that is usually included in ICs. Accordingly, it is possible to fabricate smaller printed circuit boards (PCBs) using the TCP type ICs.

Various earlier methods for soldering and mounting the TCP type ICs including a plurality of leads on the PCB have been provided. One of the methods is an earlier hot bar soldering method using a hot bar. For example, an IC including a plurality of leads formed through a cutting and forming process is placed on a PCB. Then, a heated hot bar is vertically moved down onto the IC. A recessed portion for accommodating a plastic package of the IC is formed in the bottom of the hot bar. Accordingly, when the hot bar is moved down, the bottom sidewalls of the hot bar are brought into contact with only the leads of the IC. At this time, the leads are pressed and soldered on the PCB by the heat of the hot bar.

However, the hot bar soldering method suffers disadvantages in that the leads can be damaged when over pressed by the hot bar, or conductive patterns formed on the PCB can be damaged, which can cause defects, such as a broken pattern due to high temperature of the hot bar. Furthermore, in the event that the leads are soldered under the condition that the leads are caused to slide on the PCB and come in contact with adjacent leads due to the pressure of the hot bar, defects can also be caused.

For efficient soldering, the PCBs are formed as a PCB array integrating four PCBs as a single body. The ICs are successively soldered on the PCB array by the heated hot bar. When the ICs are soldered on the first and the second PCBs, lead melted by the high temperature of the hot bar can adhere to the hot bar. This can result in poor soldering on the third and the fourth PCBs.

To overcome such disadvantages of the hot bar soldering, an earlier light beam soldering method has been provided. In the light beam soldering method, an IC is soldered by applying a xenon (Xe) light beam thereto from a predetermined distance for a predetermined amount of time. The Xe light beam generates a high temperature of 300 degrees centigrade. ICs including a plurality of leads formed through a cutting and forming process are respectively placed on a PCB array including four PCBs. The PCBs are transferred to a predetermined soldering position by a conveyor belt. Thereafter, a holding block is transferred to and vertically moved down onto an IC by a pickup.

Then, in the earlier light beam soldering method, the IC is covered by the holding block. The holding block functions to protect the plastic package of the IC from the heat of the light beam when the light beam is uniformly applied to the whole surface of the PCB as well as the leads to be soldered. The holding block has a structure that only comers thereof are extended downward. Accordingly, when the holding block covers the IC, only the leads of the IC are exposed. The light beam is continuously applied to the PCB with the holding block covering the IC. As a result, the IC is soldered on the PCB. After a predetermined amount of time, the holding block heated to a high temperature is vertically moved up to a predetermined position. In the same manner, the other ICs are soldered on the other PCBs of the PCB array.

However, the earlier light beam soldering method also suffers certain disadvantages. The holding block is heated to a high temperature while it covers the IC for the light beam soldering. Consequently, a predetermined amount of time is required to cool the heated holding block for another light beam soldering. Thus, a period of time is needed between each application of the soldering process. This results in an increased soldering time and a reduced operation efficiency. Moreover, when the time for cooling the holding block is considered, a xenon lamp cannot be used because the xenon lamp emits a great amount of heat. If the xenon lamp is not used, the time for applying a light beam is typically increased. For a practical process, approximately 24 seconds is taken to solder a PCB using the earlier light beam soldering method.

U.S. Pat. No. 4,346,514 to Makizawa et al. entitled Apparatus For Mounting Electronic Components, disclose an apparatus for mounting electronic components on a printed circuit board substrate. The apparatus is disclosed as including a component feeder for sequentially feeding the electronic components in an aligned row, a chuck which receives and rectifies by pinching the position of the electronic components, a vertically movable mounting head, which holds by air suction one of the electronic components preliminarily pinched and rectified of the position by the chuck, and goes downthrough a wide open gap of the chuck to mount the electronic component on an accurate position on the substrate.

U.S. Pat. No. 4,696,104 to Riccardo et al. entitled Method And Apparatus For Placing And Electrically Connecting Components on A Printed Circuit Board disclose a system for placing, soldering and inspecting component parts, such as soldered joints and electronic components, on a printed circuit board which utilizes a transfer device for selecting and transferring specific electronic component parts to predetermined positions on a printed circuit board and holding each component part in the desired position by use of the transfer device during a reflow soldering operation to mechanically and electrically connect the component part to the printed circuit board. It is disclosed that the reflow soldering utilizes a laser beam for injecting thermal energy into each soldered joint to melt the soldered material. An infrared detector is disclosed as sensing thermal radiation and/or reflected radiation from the heated solder material to discontinue the application of the laser beam to the solder material upon liquifaction of the solder material. The infrared detector also continues to sense the thermal radiation from the heated solder material during cool down to provide a signal which will be compared with a standard signal to determine the quality of the solder joint.

U.S. Pat. No. 4,829,665 to Kabeshita et al. entitled Method And Apparatus For Mounting Electronic Components, disclose in mounting electronic components from an electronic components pack to a substrate, the substrate is put on a table movable horizontally in X-Y directions, and the electronic components are held in through holding holes in a holding plate. It is disclosed that a selected one of the electronic components is positioned just above a mounting position on the substrate and a pushing pin is positioned just above that electronic component, the pushing pin lowers and pushes the selected electronic component down out of its holding hole to mount it directly onto the substrate.

U.S. Pat. No. 5,240,170 to Nishida et al. entitled Method For Bonding Lead Of IC Component With Electrode disclose a method for bonding leads of an IC component with electrodes of a circuit board. It is disclosed that the method includes the steps of using a mounting device to hold the IC component with flat portions of the leads inclined downward, mounting the IC component on the circuit board at a predetermined position thereof with the IC component held by the mounting device, moving the mounting device toward the circuit board to compress the IC component against the circuit board at the predetermined position while allowing the leads to flex to accommodate for nonuniformity in the heights of metal pieces to be bonded with the electrodes and bending of the circuit board. In this manner, it is disclosed that the flat portions of the leads are brought into close contact with the electrodes. It is disclosed that the leads are then irradiated with an optical beam so as to melt the metal pieces of the electrodes for bonding of the leads to the circuit board.

U.S. Pat. No. 5,501,005 to Onitsuka entitled Mounting Device Of Electronic Components And A Mounting Method discloses in an apparatus for mounting electronic components, punched out from film carriers to a substrate, there is disclosed an upper die for punching the electronic components through a hole formed in a lower die. A take out nozzle is located under the through hole for sucking the punched out electronic component from the hole in the lower die. A transfer nozzle is provided for receiving the electronic component from the take out nozzle and for transmitting the electronic component to a substrate mounted on a movable table. It is disclosed before any leadwires of the component are bonded to the electrodes of the substrate, the table is finely positioned to properly align the leadwires and the electrodes.

U.S. Pat. No. 5,579,987 to Lee et al. entitled Semiconductor Package Vertical Mounting Device And Mounting Method disclose a method and apparatus for vertically mounting a semiconductor package. It is disclosed the mounting apparatus has an extended (e.g. rectangular) shape, and is provided with a plurality of spaces adapted to receive and hold vertically semiconductor packages. It is disclosed to mount a semiconductor package in such a manner, the package is first inserted into a space in the apparatus provided therefor and fixedly held there. Next, it is disclosed, a plurality of such semiconductor packages which are so held by the mounting apparatus are positioned on a printed circuit board, and their leads are soldered thereto to complete the mounting process. It is disclosed this facilitates both surface mounting and multi-layer wiring and decreases the potential for poor quality soldering. It is disclosed, in addition, the mounting apparatus is beneficially heat dissipative, which helps to increase the life of a semiconductor package by heat which can cause deleterious thermal stresses.

U.S. Pat. No. 5,682,675 to Hirota entitled Apparatus And Method Of Mounting Electronic Components discloses a PC board that is placed at a specified position by means of a positioning device, and an electronic component to be affixed to a side of the PC board is supplied to a parts holding device by means of a carrying head. It is disclosed the parts holding device holds the electronic component with terminal leads of the electronic component facing to a side of the PC board, and the parts holding device is moved towards the PC board to affix the terminal leads of the electronic component to the side of the PC board. It is thus disclosed that terminals of the electronic component, such as connector, for example, may be automatically mounted to a side of a PC board.

U.S. Pat. No. 5,692,669 to Sakemi et al. entitled Printed Circuit Board disclose a printed circuit board including a plurality of lands onto which a plurality of leads of an electronic component are soldered. It is disclosed that these lands are arrayed in parallel to one another. Each of these lands is disclosed as including a narrow portion basically extending in a longitudinal direction thereof and having a predetermined constant width, and a wide portion protruding laterally from both edges of the narrow portion. Also a soldering method for an electronic component is disclosed including preparing a printed circuit board including a pathway and a land connected with each other, the land including a first portion extending in a predetermined direction thereof and a second portion extending from both sides of the first portion in a direction transverse to a longitudinal direction of the first portion, applying solder on a surface of the land, mounting a lead of the electronic component on the solder, and applying heat to the solder so that the solder is melted and then cooling down the solder, thereby fixing the lead of the electronic component on the land of the printed circuit board, wherein the first and the second portions are rectangular.

SUMMARY OF THE INVENTION

It is therefore an object of the present invention to considerably reduce an operation time for soldering ICs by using a plurality of holding blocks for covering an IC by turns reducing the need for an intervening time period between soldering operations.

According to an embodiment of the present invention, a method for soldering ICs on PCBs comprises the steps of: picking up a first holding block of at least two holding blocks loaded in a to holding block storing portion and covering an IC on a first PCB; applying a light beam to a whole surface of the first PCB; transferring the first holding block from the first PCB to the holding block storing portion and cooling the first holding block; transferring the first PCB to a subsequent process and transferring a second PCB from a previous process; picking up a second holding block from the holding block storing portion and covering an IC on a second PCB, wherein the above steps are repeated.

Preferably, the holding block can be fixed by a pusher before the light beam is applied. After the light beam is applied to the PCB, cool air can be applied to the PCB. The cool air is preferably applied for approximately three seconds.

According to another embodiment of the present invention, a method for soldering ICs on a PCB array including a plurality of PCBs comprises the steps of: picking up a first holding block of at least two holding blocks loaded in a holding block storing portion and covering an IC on a first PCB of the PCB array; applying a light beam to a whole surface of the first PCB; transferring the first holding block from the first PCB to the holding block storing portion and cooling the first holding block; determining whether any other PCB to be soldered exists in the PCB array or not; if it is determined that any other PCB to be soldered exists in the PCB array, picking up a second holding block from the holding block storing portion and covering an IC on the PCB to be soldered, wherein the above steps are repeated until any other PCB to be soldered does not exist in the PCB array; and if it is determined that any other PCB to be soldered does not exist in the PCB array, transferring the PCB array to a subsequent process.

The holding block can be fixed by a pusher before the light beam is applied. After the light beam is applied, cool air can be applied to the PCB. Preferably, the cool air is applied for approximately three seconds.

As the soldering process progresses for the PCB array, the amounts of time for applying the light beam to the respective PCBs of the PCB array are gradually reduced. Preferably, an amount is of time for first applying the light beam to a PCB of the PCB array is approximately 16.8 seconds.

According to a further embodiment of the present invention, an apparatus for soldering ICs on PCBs comprises: at least two holding blocks for protecting a plastic package of the IC during a soldering process; a holding block storing portion for keeping the holding blocks; a holding block pickup for sucking-in the holding blocks and transferring the holding blocks from the holding block storing portion onto the PCB by turns so that the holding block can cover the IC on the PCB; and a pusher for fixing the holding block transferred onto the PCB.

Preferably, the apparatus for soldering ICs on PCBs further comprises an apparatus for supplying the PCB with cool air. The apparatus for supplying the PCB with cool air can include a nozzle installed under the PCB. Preferably, the holding block is sucked-in and transferred by vacuum suction of the holding block pickup. The PCBs can be formed as a PCB array including a plurality of PCBs.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 4A is a view of a soldering apparatus according to the present invention including a holding block storing portion for storing a plurality of holding blocks;

DETAILED DESCRIPTION OF THE PREFERRED EMBODIMENTS

A preferred embodiment of a method and apparatus for soldering ICs on PCBs according to the present invention will be described more fully hereinafter with reference to the accompanying drawings, in which preferred embodiments of the invention are shown. This invention may, however, be embodied in many different forms and therefore should not be construed in a limiting sense.

Figure 1:
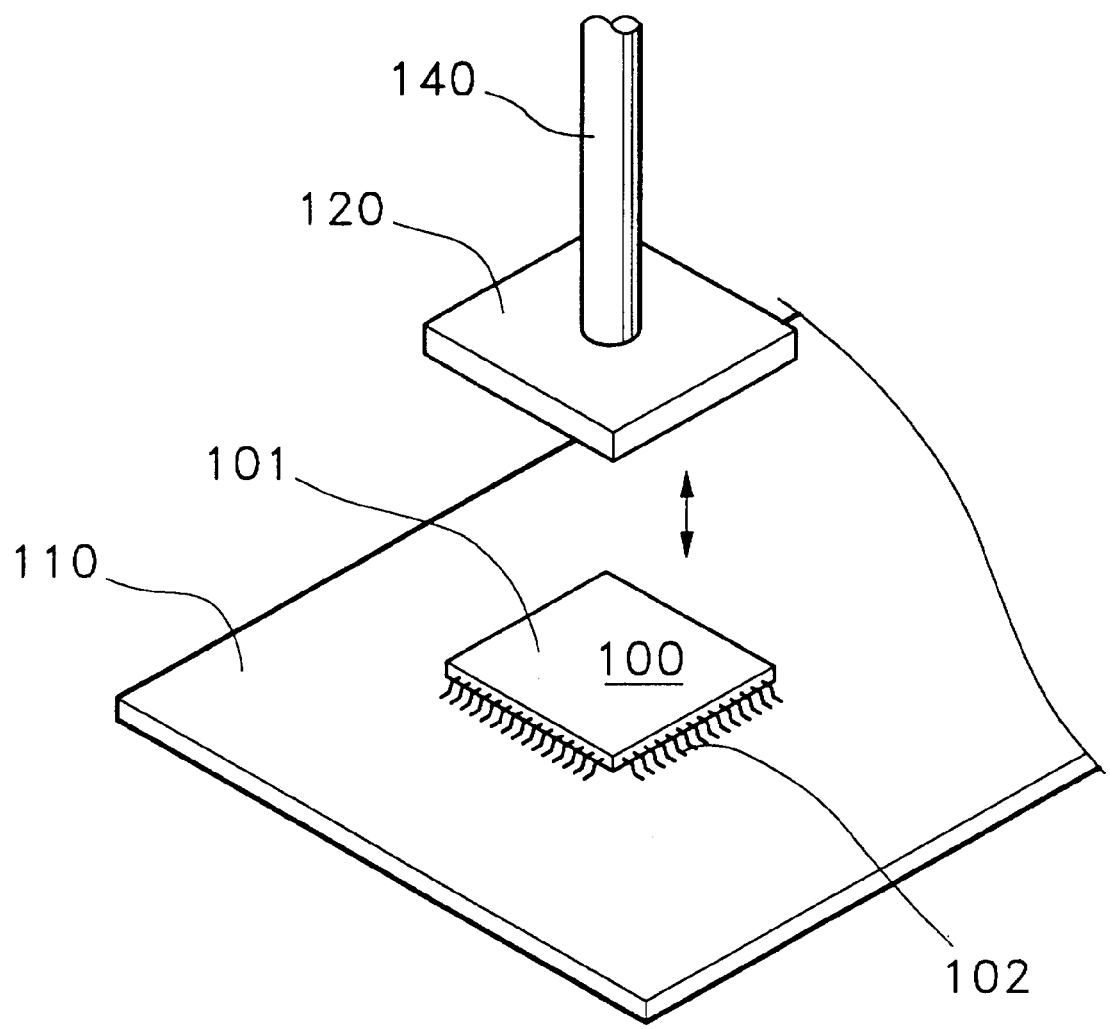
FIG. 1 is a view illustrating an earlier hot bar soldering method.

An earlier hot bar soldering method using a hot bar is described with reference to FIG. 1. Referring to FIG. 1, an IC 100 including a plurality of leads 102 formed through a cutting and forming process is placed on a PCB 110. Then, a heated hot bar 120 is vertically moved down onto the IC 100. A recessed portion (not shown) for accommodating a plastic package 101 of the IC 100 is formed in the bottom of the hot bar 120. Accordingly, when the hot bar 120 is moved down, the bottom sidewalls of the hot bar 120 are brought into contact with only the leads 102 of the IC 100. At this time, the leads 102 are pressed and soldered on the PCB 110 by the heat of the hot bar 120. For efficient soldering, the PCBs 110 are formed as a PCB array integrating four PCBs as a single body. The ICs 100 are successively soldered on the PCB array by the heated hot bar 120.

To overcome disadvantages of the earlier hot bar soldering, an earlier light beam soldering method has been provided and is described with reference to FIGS. 2–3B. In the earlier light beam soldering method, an IC is soldered by applying a xenon (Xe) light beam thereto from a predetermined distance for a predetermined amount of time. The Xe light beam generates a high temperature of 300 degrees centigrade.

Figure 2:
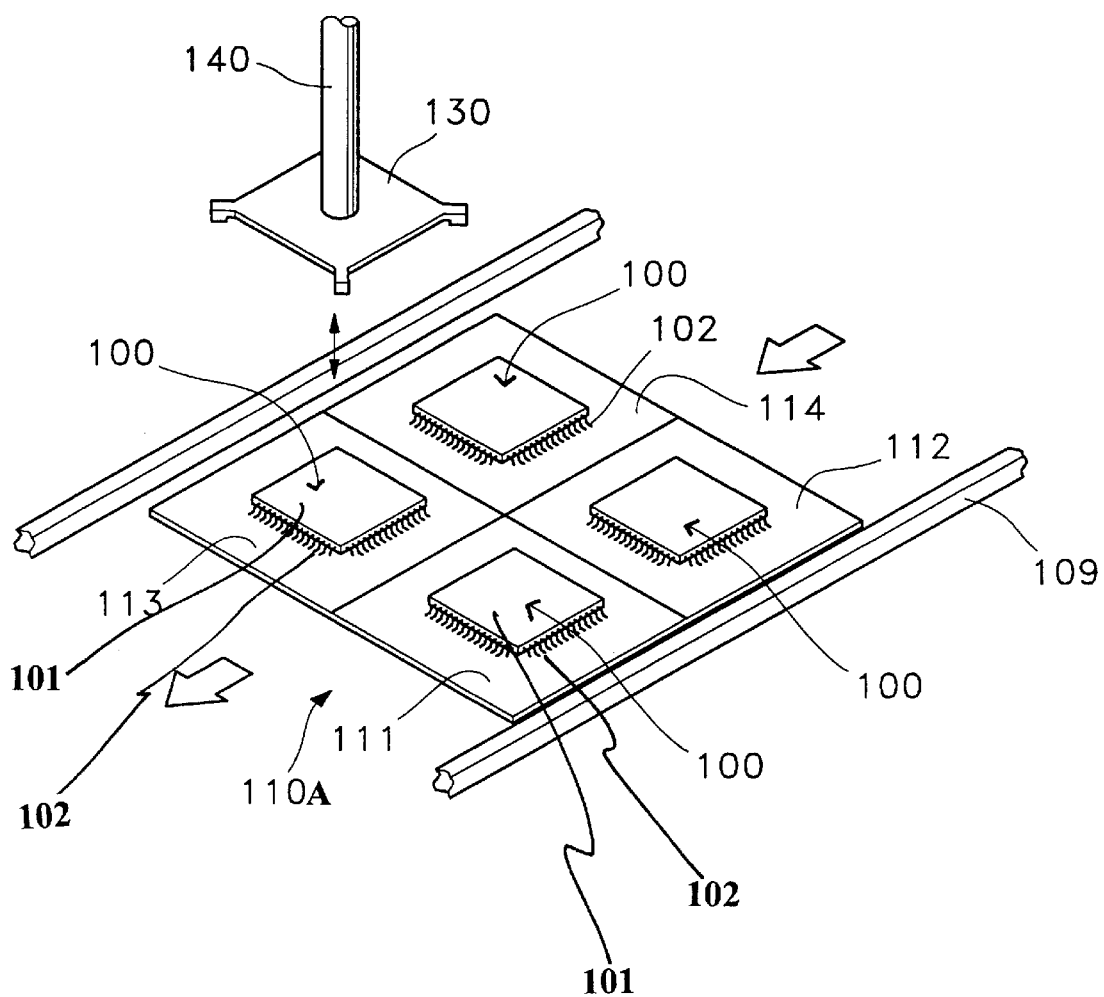
FIG. 2 is a view illustrating an earlier light beam soldering method.

Referring to FIG. 2, ICs 100 including a plurality of leads 102 formed through a cutting and forming process are respectively placed on a PCB array 110A including four PCBs 111, 112, 113 and 114. The PCBs 111, 112, 113 and 114 are transferred to a predetermined soldering position by a conveyor belt 109. Thereafter, a holding block 130 is transferred to and vertically moved down onto an IC 100 by a pickup 140.

Figure 3A:
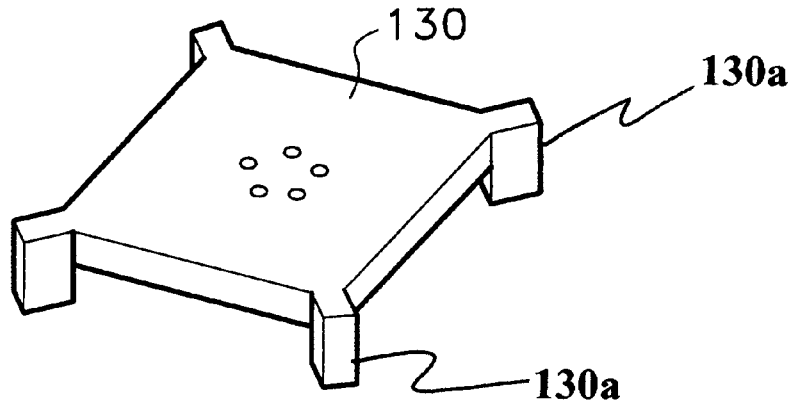
FIG. 3A is a perspective view of a holding block for use in the light beam soldering method of FIG. 2, and as can be used in the present invention.

Then, the IC 100 is covered by the holding block 130. The holding block 130 functions to protect the plastic package 101 of the IC 100 from the heat of the light beam when the light beam is uniformly applied to the whole surface of the PCB as well as the leads 102 to be soldered. As shown in FIG. 3A, the holding block 130 has a structure that only corners 130a thereof are extended downward. Accordingly, when the holding block 130 covers the IC 100, only the leads 102 of the IC 100 are exposed as shown in FIG. 3B.

The light beam is continuously applied to the PCB with the holding block 130 covering the IC 100. As a result, the IC 100 is soldered on the PCB, such as PCB 111. After a predetermined amount of time, the holding block 130 heated to a high temperature is vertically moved up to a predetermined position. In the same manner, the other ICs 100 are soldered on the other PCBs 112, 113 and 114.

Figure 4B:
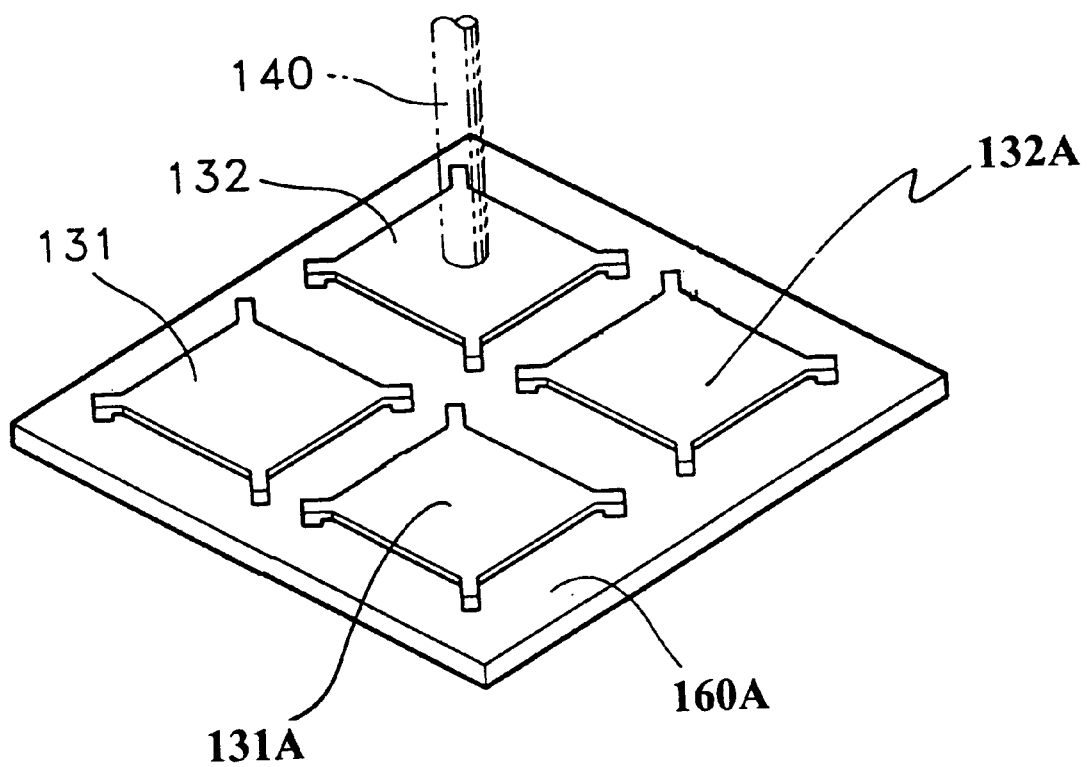
FIG. 4B illustrates a holding block storing portion for storing more than two holding blocks in the present invention.

An embodiment of a soldering apparatus according to the present invention is illustrated in FIGS. 4A and 4B. Referring to FIG. 4A, a plurality of ICs 100 including a plurality of leads 102 formed through a cutting and forming process are respectively placed on PCBs 111, 112, 113 and 114. The four PCBs 111, 112, 113 and 114 are formed as a PCB array 110A and transferred to a soldering position by a conveyor belt 109, the leads 102 of at least one IC 100 to be soldered to a PCB of PCB array 110. A holding block pickup 140 for transferring a holding block 130 to cover the IC 100 and a pusher 150 for push-fixing the holding block 130 are installed over the PCB array 110. Preferably, a nozzle 142 is installed under the PCB array 110. A cool air for cooling the PCB on which the IC is completely soldered is applied to the PCB through the nozzle 142.

Figure 3B:
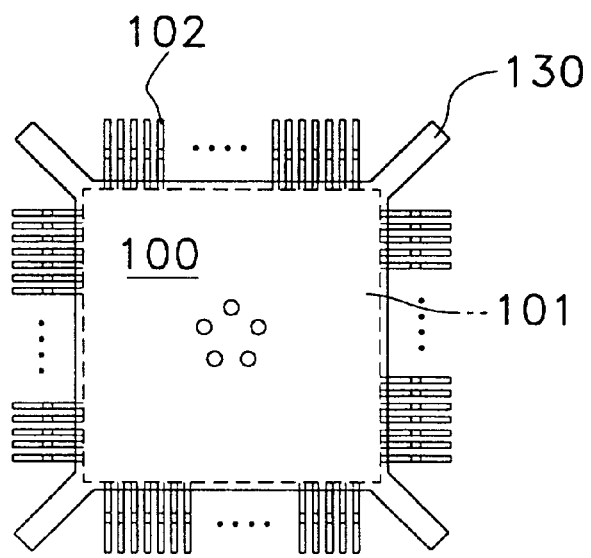
FIG. 3B is a top view of the holding block in FIG. 3A and an IC covered by the holding block.

According to the present invention, at least two holding blocks 130, such as holding blocks 131 and 132, for protecting a plastic package 101 of the IC 100 from high temperature heat during the soldering process, similar to holding block 130 as illustrated in FIGS. 3A–3B, are loaded in a holding block storing portion 160.

Preferably, according to an embodiment of the present invention, two holding blocks, such as first holding block 131 and second holding block 132 in FIG. 4A, are used in turn or by turns. While the first holding block 131 is being used for soldering, the second holding block 132 that has been used and heated during soldering can be cooled in the holding block storing portion 160 at a room temperature. Accordingly, when a soldering step using the first holding block 131 is terminated, the second holding block 132 is completely cooled and prepared for being used in another soldering step.

FIG. 4B shows an embodiment of the present invention for more than two holding blocks as can be used in the soldering process for PCBs of a PCB array, such as PCBs 111, 112, 113 and 114 of PCB array 110A of FIG. 4A. FIG. 4B illustrates four holding blocks 131, 131A, 132 and 132A on holding block storing portion 160A. The holding blocks 131, 131A, 132 and 132A can be used in turn or by turns in a soldering process or processes, such as to solder leads 102 for ICs 100 respectively to PCBs 111, 112, 113 and 114 of PCB array 110A in FIG. 4A.

For example, while a first holding block 131 is being used in a soldering process, a second holding block 132 that has been used and heated during a soldering process can be cooled in the holding block storing section 160A. When the soldering process using the first holding block 131 has been terminated, the first holding block 131 can then be stored in the holding block storing section 160A and cooled, and a third holding block 131A, can then be used for a soldering process. When the soldering process using the third holding block 131A is terminated, the third holding block can then be stored in the holding block storing section 160A and cooled, and a fourth holding block 132A can then be used for a soldering process. When the soldering process using the fourth holding block 132A is terminated, the fourth holding block 132A can be stored in the holding block storing section 160A and cooled. Continuing in turn, the second holding block 132, first used, can again be used in a soldering process.

Such use of a plurality of holding blocks, such as holding blocks 131 and 132 of the embodiment of FIG. 4A or holding blocks 131, 131A, 132 and 132A of the embodiment of FIG. 4B, can advantageously lower the operation time for a soldering process or processes, such as for a PCB array, by reducing significantly or removing the need for a cooling time between soldering steps or processes.

Figure 5:
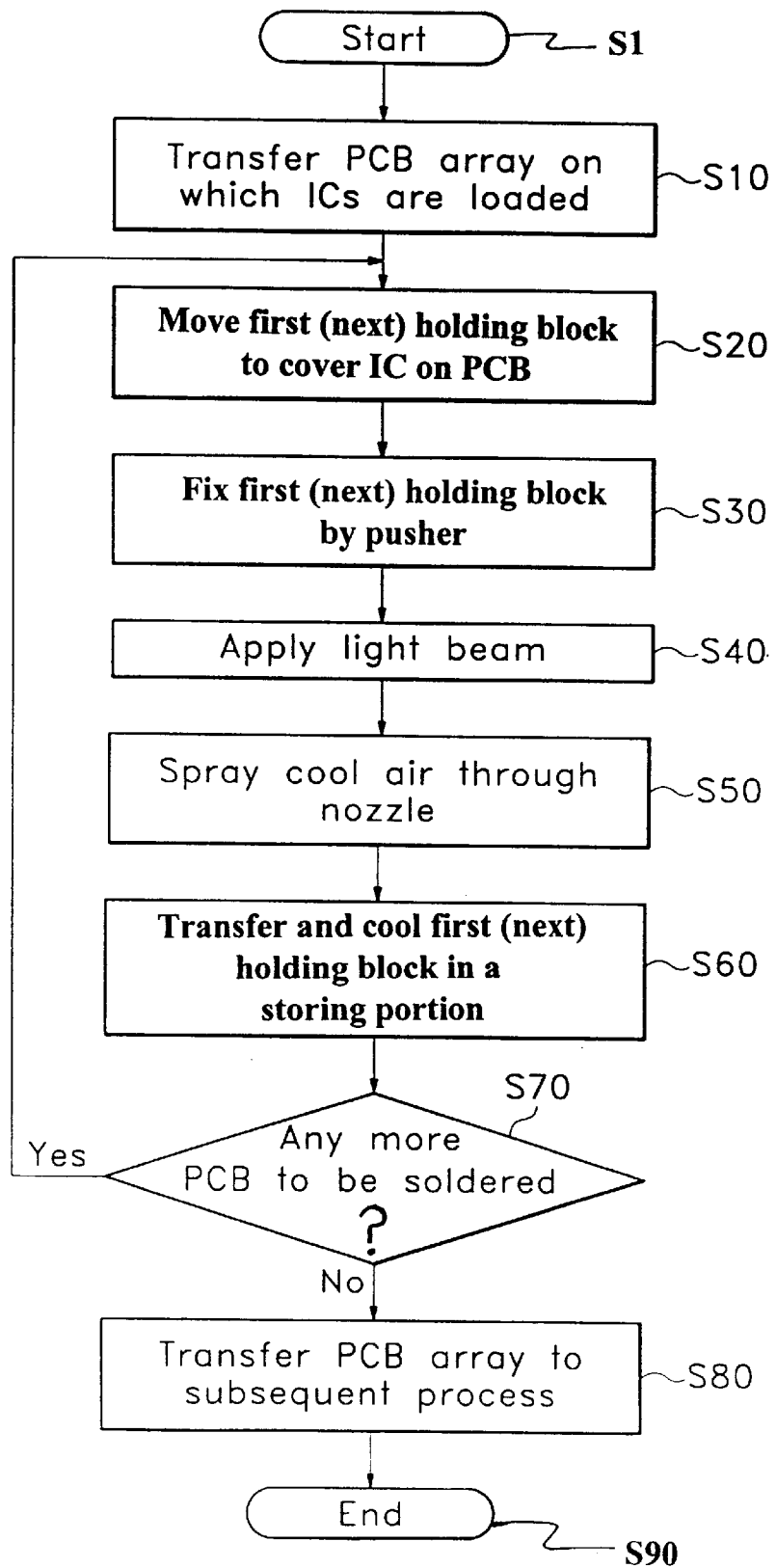
FIG. 5 is a flowchart of a soldering method according to the present invention.

A method for soldering ICs on PCBs using the above described soldering apparatus will be described with reference to a flowchart of FIG. 5, as well as to the apparatus and components illustrated in FIGS. 4A and 4B. Referring to FIG. 5, the method starts at step S1. The method then proceeds to step S10 where, at step S10, a PCB array, such as PCB array 110A including four PCBs 111, 112, 113 and 114 on which ICs 100 including a plurality of leads 102 formed through a cutting and forming process are respectively loaded, is transferred to a soldering position by a conveyor belt 109.

The method then proceeds to step S20. The step S20, a holding block pickup 140 vacuum sucks-in and picks any one of a first and a second holding blocks 131 and 132 (FIG. 4A) or any one of holding blocks 131, 131A, 132 and 132A (FIG. 4B) as, for example, the first holding block 131 from a holding block storing portion 160 in FIG. 4A.

When the holding block pickup 140 together with a holding block, such as the first holding block 131, is located on the IC 100, the suction power of the holding block pickup 140 is released. As a result, the holding block, such as the first holding block 131, is separated from the holding block pick up 140 and covers the IC 100. The method then proceeds the S30. At step S30, the holding block pickup 140 is then vertically moved up.

Thereafter, the method proceeds the step S40 where, at step S40, a light beam generated from a xenon (Xe) lamp (not shown) is applied to the whole surface of a PCB, such as a PCB 111, fixed by a pusher 150.

At this time in step S40, a PCB and a holding block, such as PCB 111 and the first holding block 131, are heated to a high temperature by the light beam. The method then proceeds to step S50 where preferably, at step S50, cool air is sprayed from a nozzle installed below a PCB, such as to the bottom of the PCB 111, whereby the PCB 111 is cooled. Preferably, an amount of time for spraying the cool air onto a PCB is approximately three seconds.

When the soldering on a PCB, such as the PCB 111, has been completed, the method proceeds to step S60 where, at the step S60, the holding block pickup 140 vacuum sucks-in a holding block, such as the first holding block 131, covering an IC, such as the IC 100 on the PCB 111, and transfers the holding block, such as the first holding block 131, to the holding block storing portion 160. The holding block, such as the first holding block 131, is cooled in the holding block 19 storing portion 160 or, alternatively, is cooled in the holding block storing portion 160A (FIG. 4B).

The method then proceeds to step S70 where, at step S70, it is determined whether any other PCB (or PCBS) to be soldered exists in the PCB array 110A. If it is determined that any other PCB (or PCBs) to be soldered exists, the process is returned to the step S20. At this time, at step S20, the holding block, such as first holding block 131, that has already been used is being cooled in the holding block storing portion 160 or, alternatively, is being cooled in a holding block storing portion 160A (FIG. 4B). Accordingly, a next holding block, such as the second holding block 132, is selected and transferred onto another PCB to be soldered. As aforementioned, the PCBs 111, 112, 113 and 114 of the PCB array 110 are respectively soldered using the holding blocks, such as holding blocks 131 and 132 (FIG. 4A) or holding blocks 131, 131A, 132 and 132A (FIG. 4B). Accordingly, any one of the first and the second holding blocks 131 and 132 waiting in the holding block storing portion 160 or holding blocks 131, 132, 131A and 132A in holding block storing portion 160A can be cooled enough while a soldering using the other holding block or holding blocks thereof is carried out.

If it is determined that no additional PCB (or PCBs) to be soldered exists in the PCB array at the step S70, the PCB array, such as PCB array 110A, is transferred to a subsequent process at step S80. The method then proceeds to end at step S90. The above soldering process illustrated in FIG. 5 can be repeated with another or other PCB arrays.

In addition, in the present invention, the amounts of the time for applying the light beam to the respective PCBs 111, 112, 113 and 114 of the PCB array can be gradually reduced. For example, when using, by turns, the first holding block 131 and second holding block 132 stored in holding block storing portion 160, the light beam is applied to the PCBs 111, 112, 113 and 114 for 16.8±1 seconds, 16.7±1 seconds, 16.6±1 seconds and 16.6±1 seconds, respectively. The reason why the amounts of the time for applying the light beam are gradually reduced, is that repeated soldering steps on the PCB array 110A substantially results in an increased time of applying the light beam to the respective PCBs 111, 112, 113 and 114 due to the latent heat thereof. In other words, when the PCB 111 of the PCB array 110 is applied with the light beam, the other PCBs 112, 113 and 114 are also applied with the light beam and heated. The increased temperature of the PCBs 112, 113 and 114 remains as latent heat. Therefore, if the PCBs 111, 112, 113 and 114 are applied with the light beam for the same amount of time, solder on a PCB can be melted and can flow along the leads 102. In the event that the solder flows along the leads 102, the leads 102 typically cannot be completely connected to the conductive pattern on the PCB, which can cause defects in the PCB. Accordingly, the PCBs 111, 112, 113 and 114 can be completely and uniformly soldered by applying the light beam for respectively reduced times in the present invention.

As aforementioned, the present invention provides an advantage of reduced operation time by using at least two holding blocks by turns and thereby removing the necessity of intermittence for cooling the holding blocks.

Also, the operation time can be reduced further by installing a nozzle for supplying cool air under the PCBs. Since the holding block can be cooled by the cool air supplied from the nozzle selectively installed under the PCB, the time that the holding block waits in the holding block storing portion can be furthermore reduced. Moreover, it is desirable that a xenon lamp emitting a large quantity of heat can be used. Thus, the time for applying the light beam can be considerably reduced.

For example, a PCB array including four PCBs can be soldered in approximately 96 seconds (24×4=96) using contemporary practice in the earlier art. However, 66.7±4 seconds (16.8+16.7+16.6+16.6±4=66.7±4) is typically required according to the present invention, thus promoting enhanced productivity.

Also, while the present invention has been described with PCB arrays including a plurality of PCBs, the present invention can be applied to individual PCBs. Further, the time for applying the light beam from the xenon lamp can be adjusted based on the consideration of the light emitting capability of the xenon lamp and the time of spraying the cool air from the nozzle.

While there have been illustrated and described what are considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation to the teaching of the present invention without departing from the scope thereof. Therefore, it is intended that the present invention not be limited to the particular embodiments disclosed as the best mode contemplated for carrying out the present invention, but that the present invention includes all embodiments falling within the scope of the appended claims.

What is claimed is:

1. A method for soldering integrated circuits on a printed circuit board, comprising the steps of:

picking up by using a holding block pickup, a holding block of at least two holding blocks loaded in a holding block storing portion;

covering an integrated circuit on a printed circuit board with said picked up holding block and then separating said holding block pickup from said picked up holding block;

applying a light beam to a surface of said printed circuit board covered with said picked up holding block;

transferring by using said holding block pickup, said holding block covering said integrated circuit on said printed circuit board to said holding block storing portion;

cooling said holding block transferred to said holding block storing portion;

picking up by using said holding block pickup, another holding block of said at least two holding blocks loaded in said holding block storing portion if another integrated circuit remains to be soldered;

covering another integrated circuit on another printed circuit board with said another holding block and then separating said holding block pickup from said another holding block;

applying a light beam to a surface of said another printed circuit board covered with said another holding block;

transferring by using said holding block pickup, said another holding block covering said another integrated circuit on said another printed circuit board to said holding block storing portion;

cooling said another holding block transferred to said holding block storing portion; and repeating said steps for soldering any other integrated circuit on any other printed circuit board.

2. The method according to claim 1, further comprising the step of using a pushing member to position a holding block covering an integrated circuit before each said step of applying said light beam.

3. The method according to claim 1, further comprising the step of applying cool air to a printed circuit board after each said step of applying said light beam.

4. The method according to claim 3, further comprised of applying said cool air for three seconds.

5. A method for soldering integrated circuits on a printed circuit board array including a plurality of printed circuit boards, comprising the steps of:

picking up by using a holding block pickup, a holding block of at least two holding blocks loaded in a holding block storing portion;

covering an integrated circuit on a printed circuit board of said printed circuit board array with said picked up holding block and then separating said holding block pickup from said picked up holding block;

applying a light beam to a surface of said printed circuit board including said integrated circuit covered with said picked up holding block;

transferring by using said holding block pickup, said holding block covering said integrated circuit on said printed circuit board to said holding block storing portion;

cooling said holding block transferred to said holding block storing portion;

determining whether another printed circuit board in said printed circuit board array is to be soldered;

if it is determined that another punted circuit board in said printed circuit board array is to be soldered, picking up by using said holding block pickup, another holding block of said at least two holding blocks loaded in said holding block storing portion;

covering another integrated circuit on another printed circuit board with said another holding block and then separating said holding block pickup from said another holding block;

applying a light beam to a surface of said another printed circuit board including said another integrated circuit covered with said another holding block;

transferring by using said holding block pickup, said another holding block covering said another integrated circuit on said another printed circuit board to said holding block storing portion;

cooling said another holding block transferred to said holding block storing portion;

repeating said steps for soldering any other integrated circuits on any other printed circuit board of said printed circuit board array; and transferring said printed circuit board array to a subsequent process if it is determined no other printed circuit board remains to be soldered in said printed circuit board array.

6. The method according to claim 5, further comprising the step of using a pushing member to position a holding block covering an integrated circuit before each said step of apply said light beam.

7. The method according to claim 5, further comprising the step of applying cool air to a printed circuit board after each said step of applying said light beam.

8. The method according to claim 7, further comprised of applying said cool air for three seconds.

9. The method according to claim 5, further comprised of gradually reducing mounts of time for application of said light beam to respective printed circuit boards of said printed circuit board.

10. The method according to Clam 9, wherein said light beam is applied for 16.8 seconds to a first printed circuit board of said printed circuit boards in said printed circuit board array on which an integrated circuit is first soldered.

11. A process for soldering an integrated circuit on a printed circuit board, with each said including a plurality of leads, comprising:

deploying at least two holding blocks, with each said holding block positioned to protect a plastic package on an integrated circuit from high temperature during a heat soldering process while soldering said plurality of leads for an integrated circuit;

establishing a holding block storing portion for storing said at least two holding blocks; and using a pickup to pick up, by turns, one holding block of said at least two holding blocks from said holding block storing portion, transferring said holding block picked up to cover an integrated circuit on a printed circuit board, for returning said holding block picked up to said holding block storing portion after a soldering process, for transferring another holding block of said at least two holding blocks from said holding block storing portion to cover another integrated circuit on another printed circuit board, and returning said another holding block to said holding block portion after a soldering process on said another integrated circuit.

12. The process according to claim 11, further comprising for applying cool air to a the printed circuit board after a soldering process on the printed circuit board is completed.

13. The process according to claim 12, further comprised of applying cool air with a nozzle installed under the printed circuit board.

14. The process according to claim 11, further comprised of arranging said printed circuit board and said another printed circuit board are included in an array including a plurality of printed circuit boards.

* * * * *